(12) United States Patent
Jeziorek

(10) Patent No.: US 9,019,710 B2
(45) Date of Patent: Apr. 28, 2015

(54) DEVICES HAVING FLEXIBLE PRINTED CIRCUITS WITH BENT STIFFENERS

(71) Applicant: Apple Inc., Cupertino, CA (US)

(72) Inventor: Peter N. Jeziorek, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 231 days.

(21) Appl. No.: 13/649,324

(22) Filed: Oct. 11, 2012

(65) Prior Publication Data

US 2014/0104792 A1  Apr. 17, 2014

(51) Int. Cl.
*H05K 1/02* (2006.01)
*H05K 1/14* (2006.01)
*H05K 3/00* (2006.01)
*H05K 1/18* (2006.01)

(52) U.S. Cl.
CPC ............. *H05K 3/0061* (2013.01); *H05K 1/189* (2013.01); *H05K 2201/057* (2013.01)

(58) Field of Classification Search
CPC . H05K 3/4641; H05K 3/0061; H05K 1/0281; H05K 1/148; H05K 1/0225
USPC .......................................... 361/749; 174/254
See application file for complete search history.

(56) References Cited

U.S. PATENT DOCUMENTS

| | | | | |
|---|---|---|---|---|
| 3,409,732 A * | 11/1968 | Dahlgren et al. | ............. | 174/254 |
| 3,646,399 A * | 2/1972 | Mars et al. | ..................... | 361/718 |
| 4,528,748 A * | 7/1985 | Eichelberger et al. | .......... | 29/835 |
| 4,677,252 A * | 6/1987 | Takahashi et al. | ............. | 174/254 |
| 4,851,613 A * | 7/1989 | Jacques | ........................ | 174/254 |
| 4,858,073 A * | 8/1989 | Gregory | ........................ | 361/708 |
| 4,958,260 A * | 9/1990 | Kobayashi et al. | ........... | 361/749 |
| 5,103,375 A * | 4/1992 | Cottingham et al. | ......... | 361/715 |
| 5,159,751 A | 11/1992 | Cottingham et al. | | |
| 5,170,326 A * | 12/1992 | Meny et al. | ................... | 361/736 |
| 5,179,501 A * | 1/1993 | Ocken et al. | .................. | 361/709 |
| 5,216,581 A * | 6/1993 | Fisher et al. | .................. | 361/728 |
| 5,265,322 A * | 11/1993 | Fisher et al. | .................... | 29/848 |
| 5,266,746 A * | 11/1993 | Nishihara et al. | ............. | 174/254 |
| 5,434,362 A * | 7/1995 | Klosowiak et al. | ........... | 174/254 |
| 5,946,195 A * | 8/1999 | Hashimoto | ................... | 361/774 |
| 5,998,738 A * | 12/1999 | Li et al. | ........................ | 174/250 |
| 6,292,370 B1 * | 9/2001 | Anderson et al. | ............. | 361/748 |
| 6,483,037 B1 * | 11/2002 | Moore et al. | .................. | 174/254 |

(Continued)

FOREIGN PATENT DOCUMENTS

DE  102007046639  *  4/2009  .............. H05K 1/00

*Primary Examiner* — Jeremy C Norris
*Assistant Examiner* — Nathan Milakovich
(74) *Attorney, Agent, or Firm* — Treyz Law Group; G. Victor Treyz; Joseph F. Guihan

(57) ABSTRACT

A flexible printed circuit may be laminated to a metal stiffener. The stiffener may be bent to hold the flexible printed circuit in a desired position. Openings may be formed in the stiffener. Metal traces on the flexible printed circuit may be accessed through the openings. Test points in the metal traces may be accessed through the openings or components may be mounted to the metal traces on the flexible printed circuit through the openings. The stiffener may have bends. The bends may be used to shape the stiffener and flexible printed circuit to form an enclosure. The openings in the stiffener may overlap the bends or may be located away from the bends. Flexible printed circuits mounted on bent stiffeners may be used to form elongated tubes with planar sides.

24 Claims, 20 Drawing Sheets

(56) References Cited

U.S. PATENT DOCUMENTS

| | | | |
|---|---|---|---|
| 6,496,382 B1* | 12/2002 | Ferguson et al. | 361/767 |
| 6,501,661 B1* | 12/2002 | Moore et al. | 361/752 |
| 6,927,344 B1* | 8/2005 | Gall et al. | 174/254 |
| 7,005,584 B2* | 2/2006 | Levi et al. | 174/254 |
| 7,075,794 B2* | 7/2006 | Gall et al. | 361/749 |
| 7,550,842 B2 | 6/2009 | Khandros et al. | |
| 7,643,305 B2 | 1/2010 | Lin | |
| 7,710,737 B2* | 5/2010 | Lynch et al. | 361/748 |
| 8,000,105 B2* | 8/2011 | Hinkle | 361/749 |
| 8,686,297 B2* | 4/2014 | Shiu et al. | 174/254 |
| 2003/0095388 A1* | 5/2003 | Jiao et al. | 361/749 |
| 2005/0082663 A1* | 4/2005 | Wakiyama et al. | 257/717 |
| 2007/0211426 A1* | 9/2007 | Clayton et al. | 361/689 |
| 2007/0281505 A1* | 12/2007 | Kobayashi et al. | 439/69 |
| 2009/0032295 A1* | 2/2009 | Okajima et al. | 174/260 |
| 2009/0032297 A1* | 2/2009 | Aallos et al. | 174/260 |
| 2010/0061070 A1* | 3/2010 | Koh | 361/764 |
| 2010/0073242 A1* | 3/2010 | Ayala Vazquez et al. | 343/702 |
| 2010/0073243 A1* | 3/2010 | Ayala Vazquez et al. | 343/702 |
| 2012/0055700 A1 | 3/2012 | Horiguchi et al. | |
| 2012/0068893 A1* | 3/2012 | Guterman et al. | 343/702 |
| 2012/0239125 A1 | 9/2012 | Greenberg et al. | |
| 2013/0148315 A1* | 6/2013 | Dabov | 361/749 |
| 2013/0329396 A1* | 12/2013 | Smith et al. | 362/23.03 |
| 2014/0048314 A1* | 2/2014 | Kido et al. | 174/254 |
| 2014/0177180 A1* | 6/2014 | Malek et al. | 361/749 |

\* cited by examiner

DEVICES HAVING FLEXIBLE PRINTED CIRCUITS WITH BENT STIFFENERS

BACKGROUND

This relates generally to electronic devices and, more particularly, to electronic devices with flexible printed circuit structures.

Electronic devices often include printed circuits. Rigid printed circuits are formed from materials such as fiberglass-filled epoxy that are inflexible. Flexible printed circuits are formed from layers of polyimide or other sheets of flexible polymer. Integrated circuits, sensors, cameras, and other components may be mounted to pattered metal traces on rigid and flexible printed circuits.

In some device configurations, it can be difficult or impossible to mount components within a device housing rigid printed circuits. Flexible printed circuits can be used to address these challenging mounting conditions. Flexible printed circuits may, however, offer insufficient mounting stability. If care is not taken, a component that is mounted to a flexible printed circuit in an electronic device may move during use of the device by a user. This may cause damage to the component and may give rise to reliability issues.

It would therefore be desirable to be able to provide improved arrangements for mounting components in electronic devices using flexible printed circuits.

SUMMARY

A flexible printed circuit may be formed from a flexible sheet of polymer such as a layer of polyimide. Metal traces may be formed in the flexible printed circuit. The flexible printed circuit may be laminated to a metal stiffener such as a sheet of stainless steel or other metal.

The stiffener may be bent to hold the flexible printed circuit in a desired position. Openings may be formed in the stiffener. Metal traces on the flexible printed circuit may be accessed through the openings. For example, test points may be accessed through the openings and components may be mounted to the flexible printed circuit through the openings.

The stiffener may be used to form a mounting bracket for a component in an electronic device. Screws or other fasteners may be used to mount the stiffener within a device housing and may be used to mount components to the stiffener.

The stiffener may have bends. The bends may be used to shape the stiffener and flexible printed circuit to form an enclosure. Integrated circuits or other components may be mounted in the enclosure. Components may also be mounted to exterior portions of the enclosure. The openings in the stiffener may overlap the bends or may be located so as to be formed on a planar portion of the flexible printed circuit.

Flexible printed circuits mounted on bent stiffeners may be used to form elongated tubes with planar sides. Flexible printed circuits may be mounted on one or both sides of a sheet metal stiffener. Elongated tube-shaped flexible printed circuits with stiffeners may be mounted within housing enclosures such as clutch barrel enclosures in a laptop computer.

Further features, their nature and various advantages will be more apparent from the accompanying drawings and the following detailed description of the preferred embodiments.

DETAILED DESCRIPTION

Illustrative electronic devices that have flexible printed circuits with stiffeners are shown in FIGS. 1, 2, 3, and 4.

Figure 1:
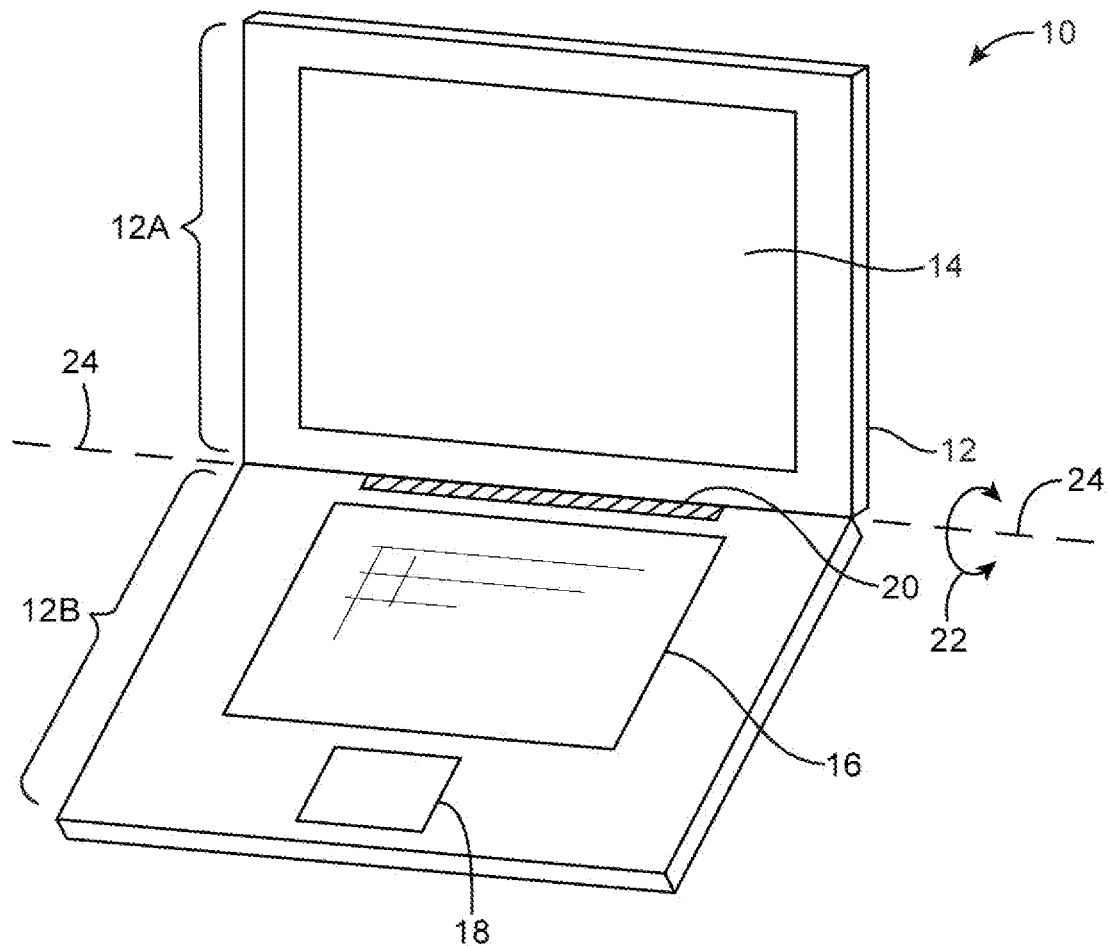
FIG. 1 is a perspective view of an illustrative electronic device such as a laptop computer with flexible printed circuit component mounting structures in accordance with an embodiment.

Electronic device 10 of FIG. 1 has the shape of a laptop computer and has upper housing 12A and lower housing 12B with components such as keyboard 16 and touchpad 18. Device 10 has hinge structures 20 (sometimes referred to as a clutch barrel) to allow upper housing 12A to rotate in directions 22 about rotational axis 24 relative to lower housing 12B. Display 14 is mounted in upper housing 12A.

Upper housing 12A, which may sometimes be referred to as a display housing or lid, is placed in a closed position by rotating upper housing 12A towards lower housing 12B about rotational axis 24.

Figure 2:
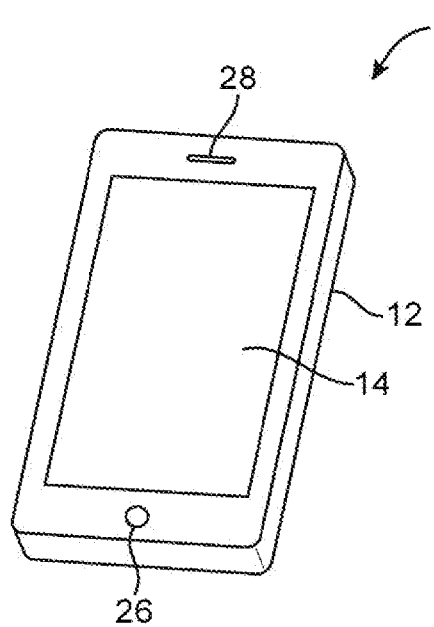
FIG. 2 is a perspective view of an illustrative electronic device such as a handheld electronic device with flexible printed circuit component mounting structures in accordance with an embodiment.

FIG. 2 shows an illustrative configuration for electronic device 10 based on a handheld device such as a cellular telephone, music player, gaming device, navigation unit, or other compact device. In this type of configuration for device 10, housing 12 has opposing front and rear surfaces. Display 14 is mounted on a front face of housing 12. Display 14 may have an exterior layer that includes openings for components such as button 26 and speaker port 28.

Figure 3:
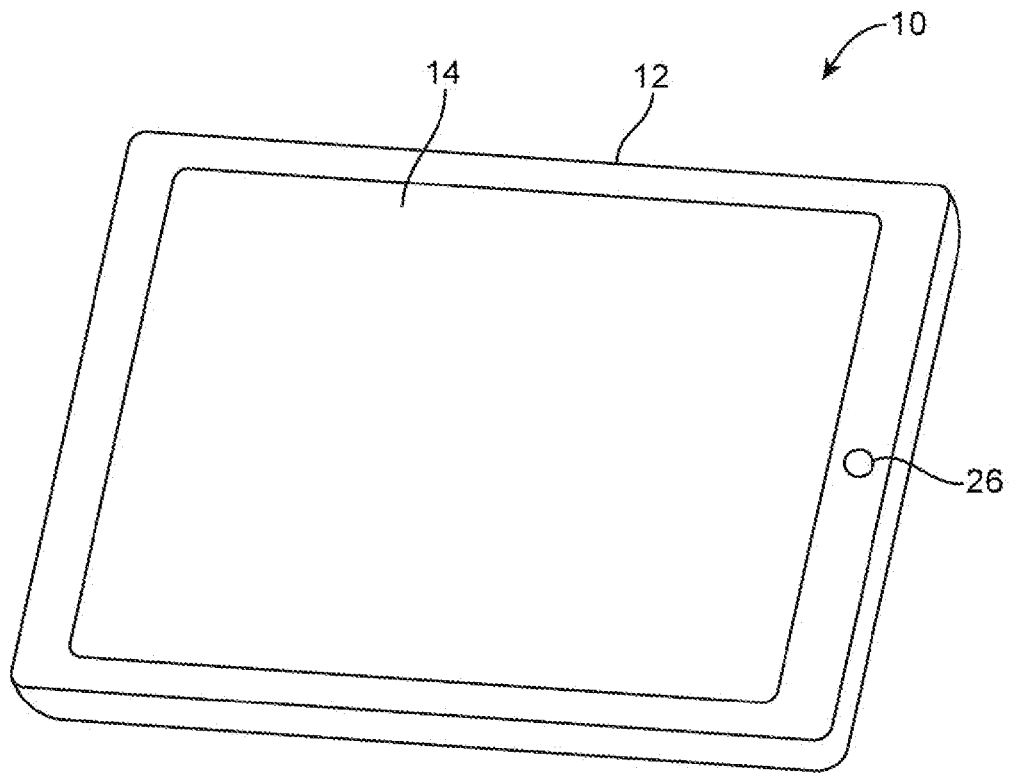
FIG. 3 is a perspective view of an illustrative electronic device such as a tablet computer with flexible printed circuit component mounting structures in accordance with an embodiment.

In the example of FIG. 3, electronic device 10 is a tablet computer. In electronic device 10 of FIG. 3, housing 12 has opposing planar front and rear surfaces. Display 14 is mounted on the front surface of housing 12. As shown in FIG. 3, display 14 has an external layer with an opening to accommodate button 26.

Figure 4:
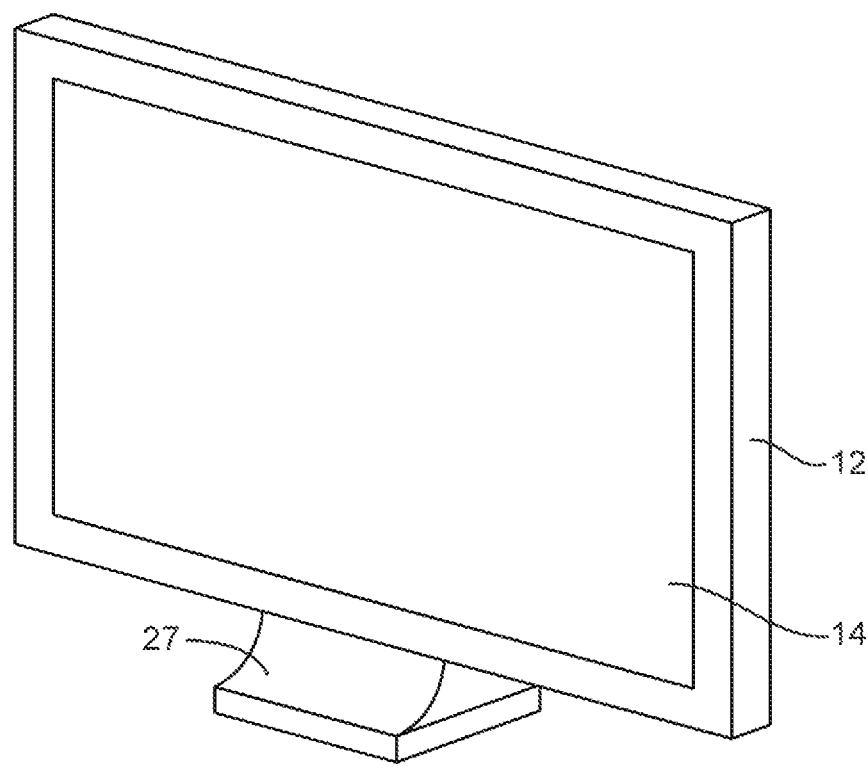
FIG. 4 is a perspective view of an illustrative electronic device such as a computer display with flexible printed circuit component mounting structures in accordance with an embodiment.

FIG. 4 shows an illustrative configuration for electronic device 10 in which device 10 is a computer display or a computer that has been integrated into a computer display. With this type of arrangement, housing 12 for device 10 is mounted on a support structure such as stand 27. Display 14 is mounted on a front face of housing 12.

The electrical devices of FIGS. 1, 2, 3, and 4 have electrical components mounted on flexible printed circuits with stiffeners. The illustrative configurations for device 10 that are shown in FIGS. 1, 2, 3, and 4 are merely illustrative. In general, electronic device 10 may be a laptop computer, a computer monitor containing an embedded computer, a tablet computer, a cellular telephone, a media player, or other handheld or portable electronic device, a smaller device such as a wrist-watch device, a pendant device, a headphone or earpiece device, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

Housing 12 of device 10, which is sometimes referred to as a case, is formed of materials such as plastic, glass, ceramics, carbon-fiber composites and other fiber-based composites, metal (e.g., machined aluminum, stainless steel, or other metals), other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Display 14 may be a touch sensitive display that includes a touch sensor or may be insensitive to touch. Touch sensors for display 14 may be formed from an array of capacitive touch sensor electrodes, a resistive touch array, touch sensor structures based on acoustic touch, optical touch, or force-based touch technologies, or other suitable touch sensor components.

Display 14 for device 10 includes display pixels formed from liquid crystal display (LCD) components or other suitable image pixel structures.

A display cover layer may cover the surface of display 14 or a display layer such as a color filter layer or other portion of a display may be used as the outermost (or nearly outermost) layer in display 14. The outermost display layer may be formed from a transparent glass sheet, a clear plastic layer, or other transparent member.

Figure 5:
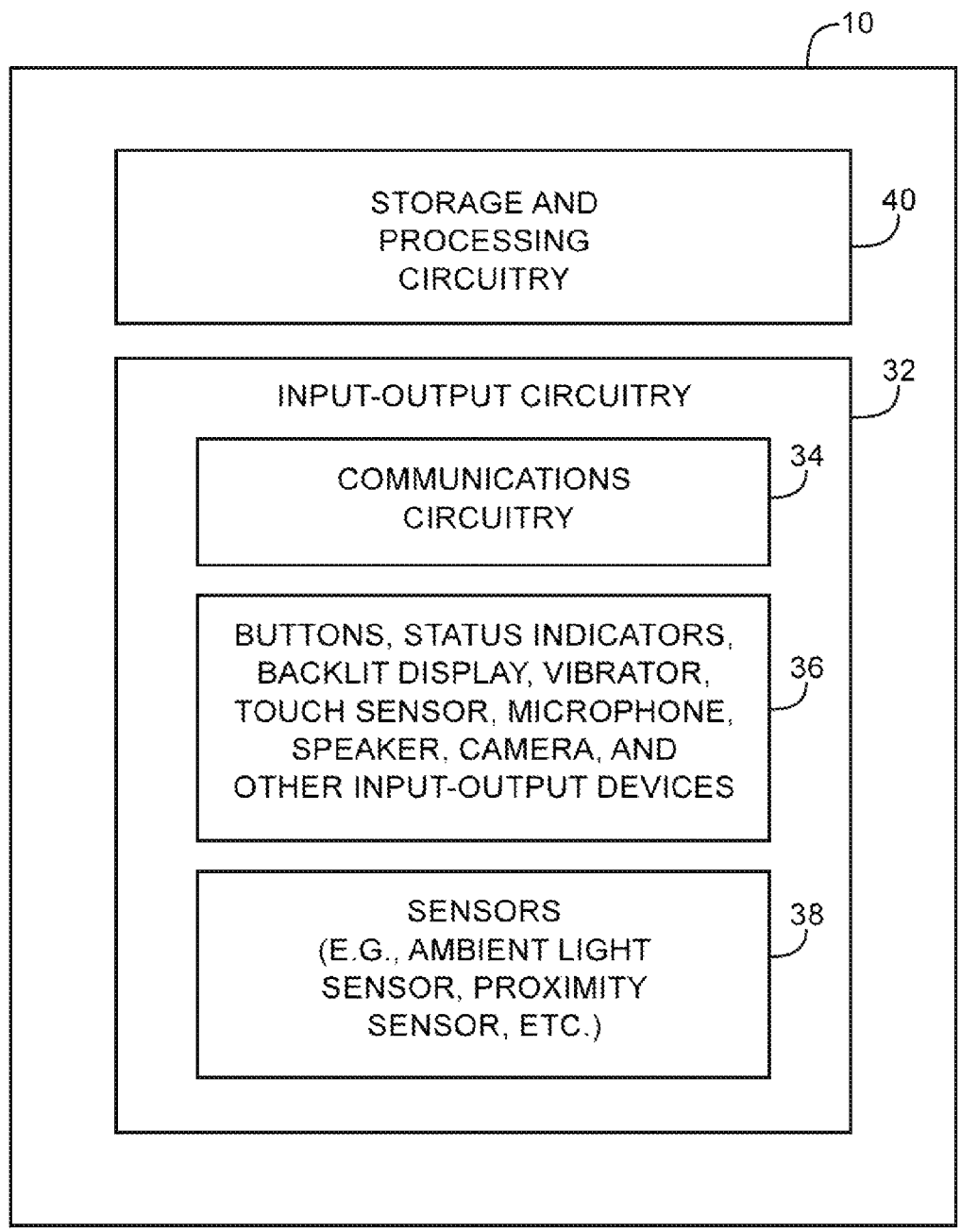
FIG. 5 a schematic diagram of an illustrative electronic device of the type that may be provided with flexible printed circuit component mounting structures in accordance with an embodiment.

A schematic diagram of device 10 is shown in FIG. 5. As shown in FIG. 5, electronic device 10 includes control circuitry such as storage and processing circuitry 40. Storage and processing circuitry 40 includes one or more different types of storage such as hard disk drive storage, nonvolatile memory (e.g., flash memory or other electrically-programmable-read-only memory), volatile memory (e.g., static or dynamic random-access-memory), etc. Processing circuitry in storage and processing circuitry 40 is used in controlling the operation of device 10. The processing circuitry may be based on a processor such as a microprocessor and other integrated circuits.

With one suitable arrangement, storage and processing circuitry 40 is used to run software on device 10 such as internet browsing applications, email applications, media playback applications, operating system functions, software for capturing and processing images, software for implementing functions associated with gathering and processing sensor data, etc.

Input-output circuitry 32 is used to allow data to be supplied to device 10 and to allow data to be provided from device 10 to external devices.

Input-output circuitry 32 can include wired and wireless communications circuitry 34. Communications circuitry 34 may include radio-frequency (RF) transceiver circuitry formed from one or more integrated circuits, power amplifier circuitry, low-noise input amplifiers, passive RF components, one or more antennas, and other circuitry for handling RF wireless signals. Wireless signals can also be sent using light (e.g., using infrared communications).

Input-output circuitry 32 of FIG. 5 includes input-output devices 36 such as buttons, joysticks, click wheels, scrolling wheels, a touch screen such as display 14, other touch sensors such as track pads or touch-sensor-based buttons, vibrators, audio components such as microphones and speakers, image capture devices such as a camera module having an image sensor and a corresponding lens system, keyboards, status-indicator lights, tone generators, key pads, and other equipment for gathering input from a user or other external source and/or generating output for a user.

Sensors 38 of FIG. 5 include an ambient light sensor for gathering information on ambient light levels. The ambient light sensor includes one or more semiconductor detectors (e.g., silicon-based detectors) or other light detection circuitry. Sensors 38 also include proximity sensor components. The proximity sensor components may include a dedicated proximity sensor and/or a proximity sensor formed from touch sensors (e.g., a portion of the capacitive touch sensor electrodes in a touch sensor array for display 14 that are otherwise used in gathering touch input for device 10). Proximity sensor components in device 10 can include capacitive proximity sensor components, infrared-light-based proximity sensor components, proximity sensor components based on acoustic signaling schemes, or other proximity sensor equipment. Sensors 38 may also include a pressure sensor, a temperature sensor, an accelerometer, a gyroscope, and other circuitry for making measurements of the environment surrounding device 10.

It can be challenging to mount electrical components such as the components of FIG. 5 within an electronic device. To facilitate mounting of components in housing 12 of device 10, components may be mounted on a flexible printed circuit.

A flexible printed circuit has a flexible dielectric substrate formed from a sheet of polyimide or other flexible layer of polymer. A flexible printed circuit also has patterned conductive traces such as one or more layers of patterned metal traces.

Stiffening structures formed from metal or other materials are used to stiffen the flexible printed circuit. Stiffening structures are attached to the flexible printed circuit using adhesive. Bent stiffening structures allow the flexible printed circuit to fit within the potentially tight confines of electronic device 10 and other structures.

A sheet of metal such as a layer of metal having a thickness of 0.1 mm to 0.3 mm or other suitable thickness may be used to stiffen a flexible printed circuit, so illustrative configurations for stiffeners that are formed from sheet metal are sometimes described herein as an example. This is, however, merely illustrative. Flexible printed circuit stiffeners may, in general, be formed from any suitable material.

Figure 6:
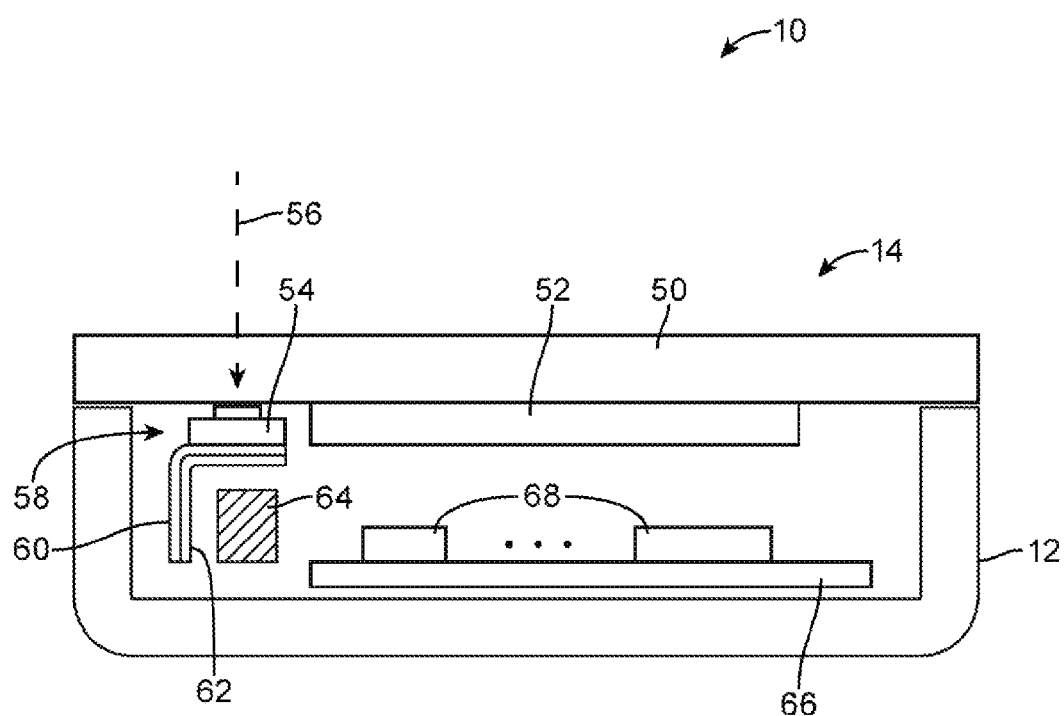
FIG. 6 is a cross-sectional side view of an illustrative electronic device having flexible printed circuit component mounting structures in accordance with an embodiment.

FIG. 6 is a cross-sectional side view of an illustrative device showing how a flexible printed circuit with a stiffener can be mounted within the device. As shown in FIG. 6, electronic device 10 has housing 12. Display 14 is mounted in housing 12. Display 14 has a display cover layer such as display cover layer 50 and a display module such as display module 52. Display cover layer 50 is a clear transparent member such as a layer of clear glass or a layer of transparent plastic. Display module 52 contains liquid crystal display structures, electrowetting display structures, electrophoretic display structures, organic light-emitting diode display structures, or other display structures.

Device 10 of FIG. 6 contains printed circuit board 66 and flexible printed circuit structure 58. Components 68 are mounted on printed circuit 66. Components such as component 54 are mounted on flexible printed circuit board 60. Flexible printed circuit board 60 is stiffened using bent stiffener 62 to form stiffened flexible printed circuit structures 58.

Components 68 and 54 may include integrated circuits, sensors, cameras, buttons, and other components (e.g., circuitry such as storage and processing circuitry 40 and input-output circuitry 32 of FIG. 5). Components such as component 54 are mounted on printed circuits such as flexible printed circuit 60. With one illustrative example, component 54 is an ambient light sensor, camera module, or other electronic component. Components 68 are integrated circuits, circuitry such as circuitry 40 and 32 of FIG. 5, camera module structures, light sensors such as ambient light sensors, proximity sensors, etc. Printed circuit board 66 is preferably a rigid printed circuit board formed from a substrate material such as fiberglass-filled epoxy. Components 68 are soldered or otherwise electrically mounted on printed circuit board 66.

Components such as component 64 are mounted in the interior of device 10. To avoid interference with internal device structures such as component 64, printed circuit structures 58 are provided with one or more bends, as shown by the illustrative right-angle bend of FIG. 6. As shown in FIG. 6, component 54 may be mounted under a portion of display cover layer 50. As an example, component 54 may be a camera that receives light 56 that is associated with an image through display cover layer 50. Components such as component 54 may, in general, be any suitable type of component (e.g., a sensor, integrated circuit, connector, discrete component, light-emitting component, audio device, etc.). The use of a camera in the configuration of FIG. 6 is merely illustrative.

Flexible printed circuit material 60 is generally too flexible to independently retain a desired bent shape. However, stiffener 62 is formed from a material that is sufficiently stiff to resist unbending forces. For example, stiffener 62 can be formed from a sheet of stainless steel or other metal that retains its shape following bending (e.g., a sheet of metal having a thickness of less than 0.4 mm, of 0.05 to 0.35 mm, of 0.15 to 0.25 mm, etc.).

To retain the shape of bent printed circuit structures 58 of FIG. 6, stiffener 62 is bent at a 90° angle, thereby holding flexible printed circuit 60 in a configuration with a 90° bend. Bent flexible printed circuit structures 58 with bends of other angles may also be used in device 10, if desired.

Figure 7:
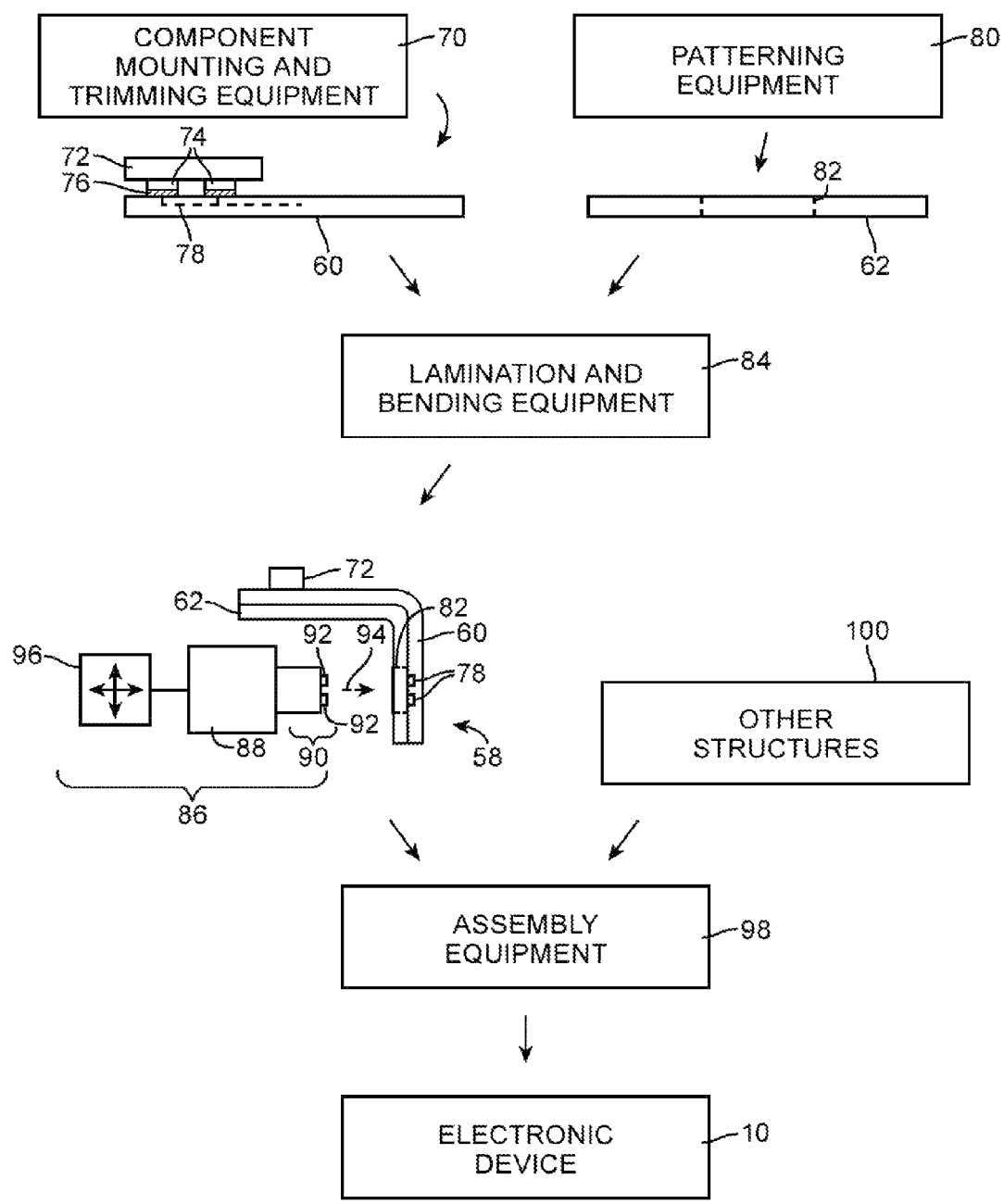
FIG. 7 is a diagram of an illustrative system being used to form an electronic device having components mounted using a flexible printed circuit with a stiffener in accordance with an embodiment.

Illustrative equipment for forming bent flexible printed circuit structures 58 and devices 10 incorporating bent flexible printed circuit structures 58 is shown in FIG. 7.

Patterning equipment 80 is used to form stiffening structures such as stiffener 62. Equipment 80 may include lasers, milling bits and other machining bits, dies for patterning metal by stamping, and other equipment for patterning metal sheets. As shown in FIG. 7, equipment 80 may be used to form stiffeners such as stiffener 62. Stiffener 62 may be devoid of openings or may have one or more openings such as opening 82.

Component mounting and flexible printed circuit patterning equipment 70 is used to form patterned flexible printed circuits (e.g., by laser trimming, die cutting, or other cutting techniques) and is used to mount components such as component 72. Component 72 may be an integrated circuit, a camera, an ambient light sensor or other sensor, other components, etc. Solder 74 electrically connects pads in component 72 to pads 76 that are part of metal traces 78 on flexible printed circuit 60.

After forming a patterned flexible printed circuit with optional openings and mounted components such as component 72, lamination and bending equipment 84 can create bent flexible printed circuit structures 58. Lamination and bending equipment 84 may, for example, use adhesive to attach flexible printed circuit 60 to metal stiffener 62 and may use a computer-controlled press or other bending tool to bend stiffener 62 and flexible printed circuit 60 into a desired shape.

As shown in the illustrative example of FIG. 7, bent flexible printed circuit structures 58 can be tested using tester 86. Tester 86 includes a testing tool such as testing tool 88. Computer-controlled positioner 96 controls the position of tester 88. Test head 90 has probe pins 92 that are configured to mate with test pads 78 in the metal traces on flexible printed circuit 60. Due to the presence of opening 82, test pins 92 contact test pads 78 on flexible printed circuit 60 when tester 88 and test head 90 are moved in direction 94 during testing.

If testing indicates that flexible printed circuit structures 58 include one or more faults, flexible printed circuit structures 58 can be repaired or discarded. If testing with system 86 indicates that flexible printed circuits 58 are operating satisfactorily, flexible printed circuit structures 58 and other structures 100 (e.g., housing structures, additional components, etc.) may be assembled using assembly equipment 98 to produce finished electronic device 10.

Figure 8A:
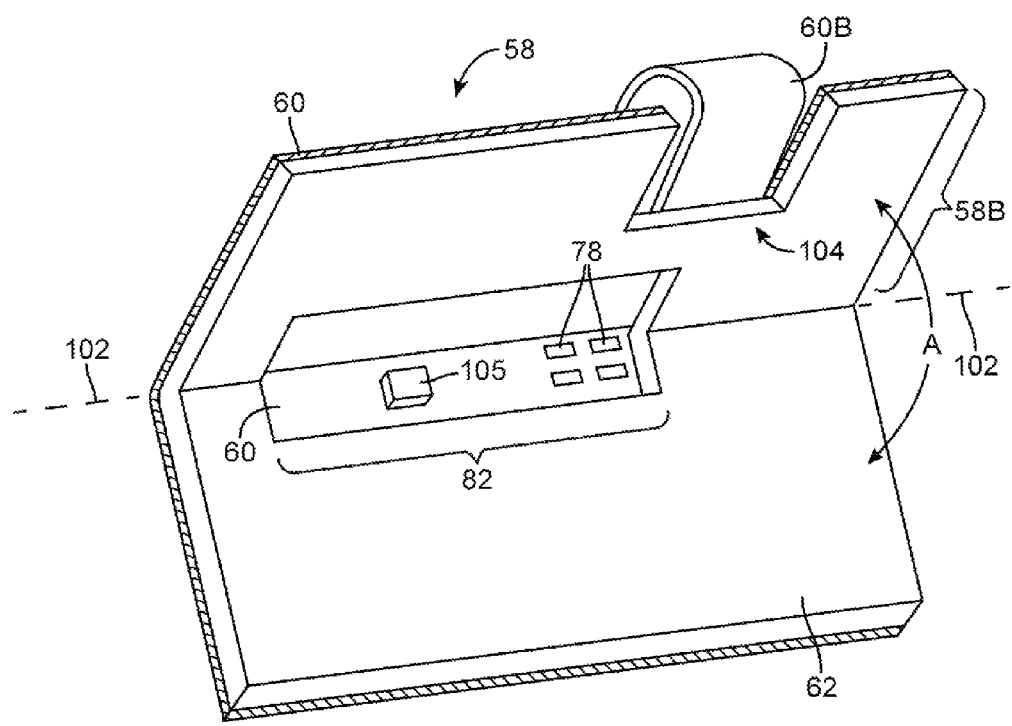
FIG. 8A is a front perspective view of an illustrative flexible printed circuit with a bent stiffener in accordance with an embodiment.

FIG. 8A is a front perspective view of illustrative bent flexible printed circuit structures 58. As shown in FIG. 8A, bent flexible printed circuit structures 58 include flexible printed circuit 60 and metal stiffener 62. Stiffener 62 and flexible printed circuit 60 are bent at an angle A around bend axis 102. Angle A may have a value of 10-20°, 10-60°, 5-175°, 30-120°, less than 150°, less than 110°, 90°, 45°, less than 60°, 10-50°, more than 15°, or other suitable angle.

Opening 82 may overlap bend axis 102. In configurations in which opening 82 overlaps bend axis 102, the flexibility of stiffener 62 is enhanced. Any suitable number of openings 82 may overlap bend axis 102 (e.g., one or more, two or more, three or more, etc.).

Stiffener 62 of FIG. 8A has a notch. Notch 104 allows flexible printed circuit tail 60B of flexible printed circuit 60 to bend with respect to stiffener 62 (i.e., tail 60B may bend out of the plane that includes portion 58B of stiffener 62 and flexible printed circuit 60. If desired, one or more notches such as notch 104 may be located at the corners of stiffener 62 (e.g., notches may be formed by removing rectangular corner portions of stiffener 62).

Figure 8B:
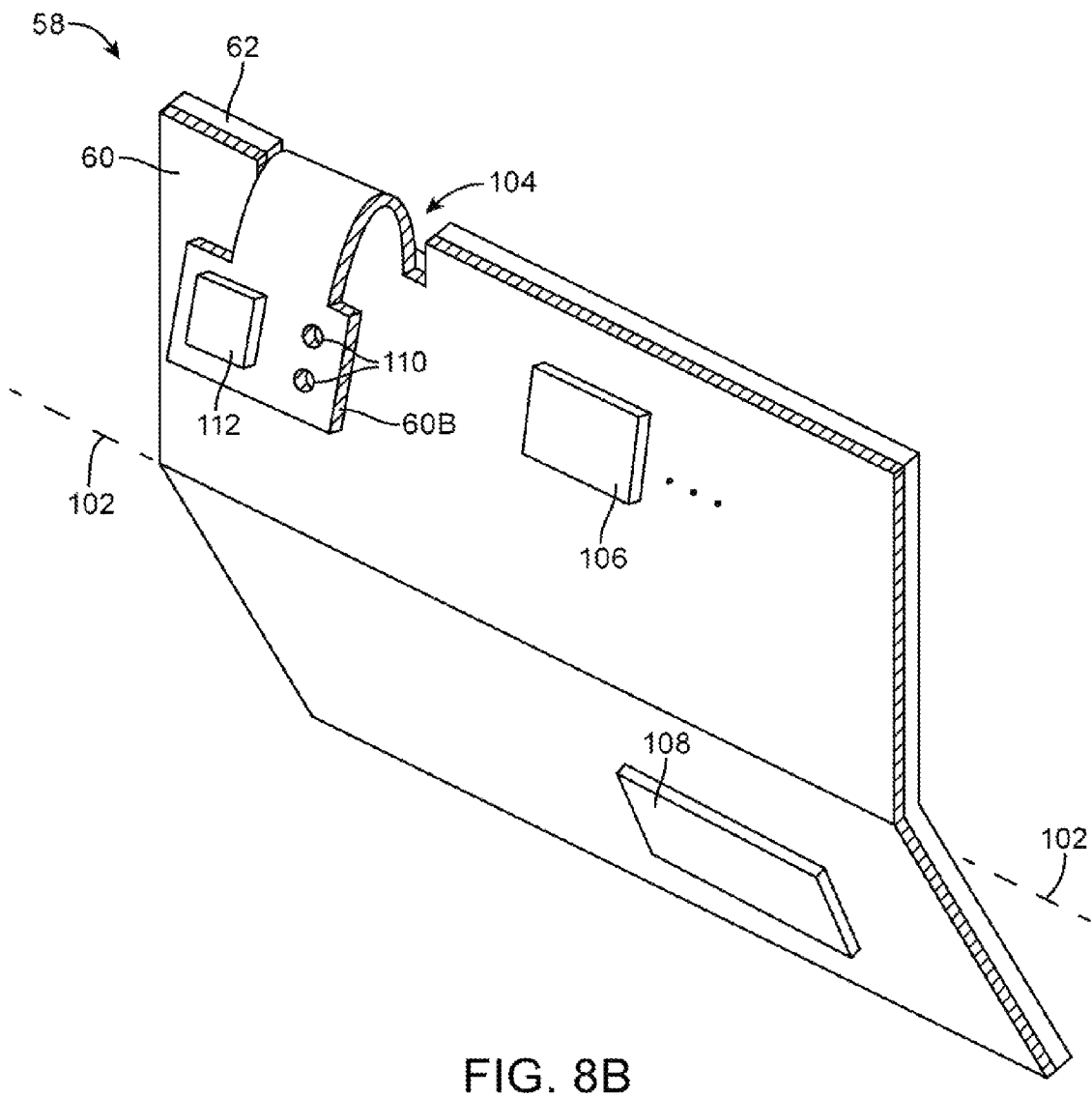
FIG. 8B is a rear perspective view of the illustrative flexible printed circuit with the bent stiffener of FIG. 8A in accordance with an embodiment.

Test pads 78 are accessible through opening 82 by test system 86. If desired, one or more components such as component 105 may be mounted on flexible printed circuit 60 in opening 104. Components such as components 106 and 108 of FIG. 8B can also be mounted on the rear surface of flexible printed circuit 60. Component 108 can be a connector such as a board to board connector. Component 106 can be an integrated circuit or other device.

Tail portion 60B of flexible printed circuit 60 has openings 110. Screws or other fasteners can pass through openings 110 (e.g., to attach tail portion 60B to a housing structure or other structure). Components such as component 112 may be attached to flexible printed circuit tail 60B. As an example, component 112 may be an ambient light sensor.

Figure 9:
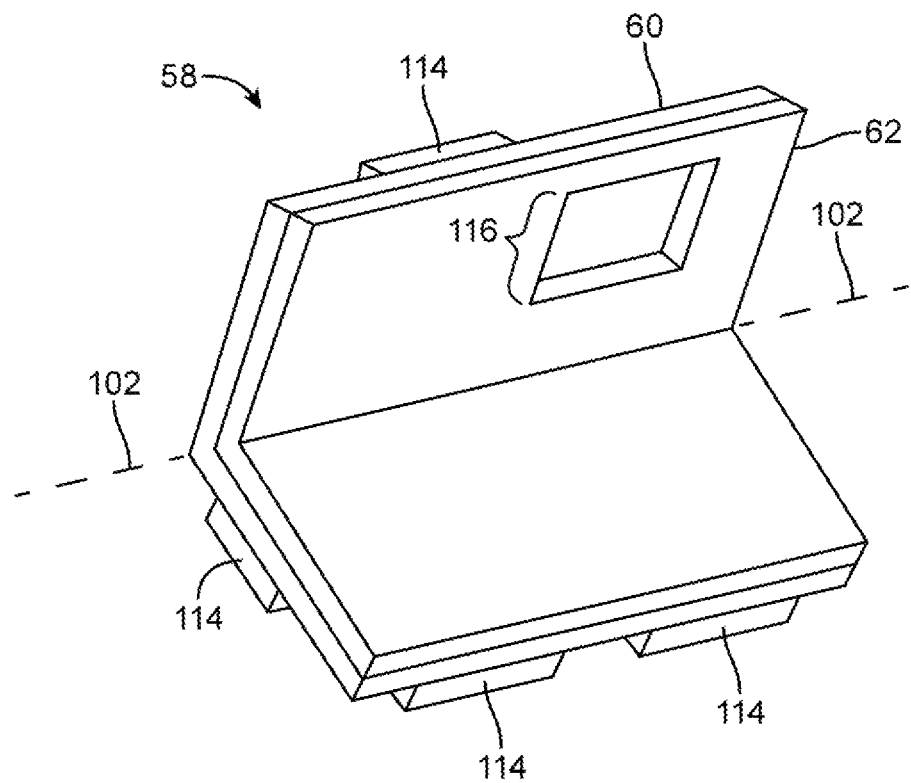
FIG. 9 is a perspective view of an illustrative flexible printed circuit having a stiffener that is bent along a bend axis that does not overlap an opening in the stiffener in accordance with an embodiment.

In the example of FIG. 9, flexible printed circuit structures 58 have been bent to form a right angle in stiffener 62 and flexible printed circuit 60 along bend axis 102. Opening 116 does not overlap bend axis 102, thereby increasing the stiffness of stiffener 62 along the bend. Components 114 are formed on flexible printed circuit 60 (e.g., on portions of flexible printed circuit 60 above and below bend axis 102).

Bent flexible printed circuit structures 58 can be used to form structural elements of device 10 such as mounting brackets or other component support structures. In the illustrative configuration of FIG. 10, for example, fasteners such as screws 118 are being used to attach flexible printed circuit structures 58 to device structures 120 (e.g., internal or external housing structures such as portions of housing 12). Components such as component 122 (e.g., a connector, camera, etc.) are also attached to flexible printed circuit structures 58 using screws 118. In this way, structures 58 serve as a mounting bracket or support structure for component 122 to help mount component 122 within device 10. Components 124 (e.g., integrated circuits, sensors, cameras, etc.) are mounted to flexible printed circuit 60 in flexible printed circuit structures 58 using solder. Circular openings or openings of other shapes are formed in flexible printed circuit 60 and stiffener 62 to accommodate screws 118.

Figure 10:
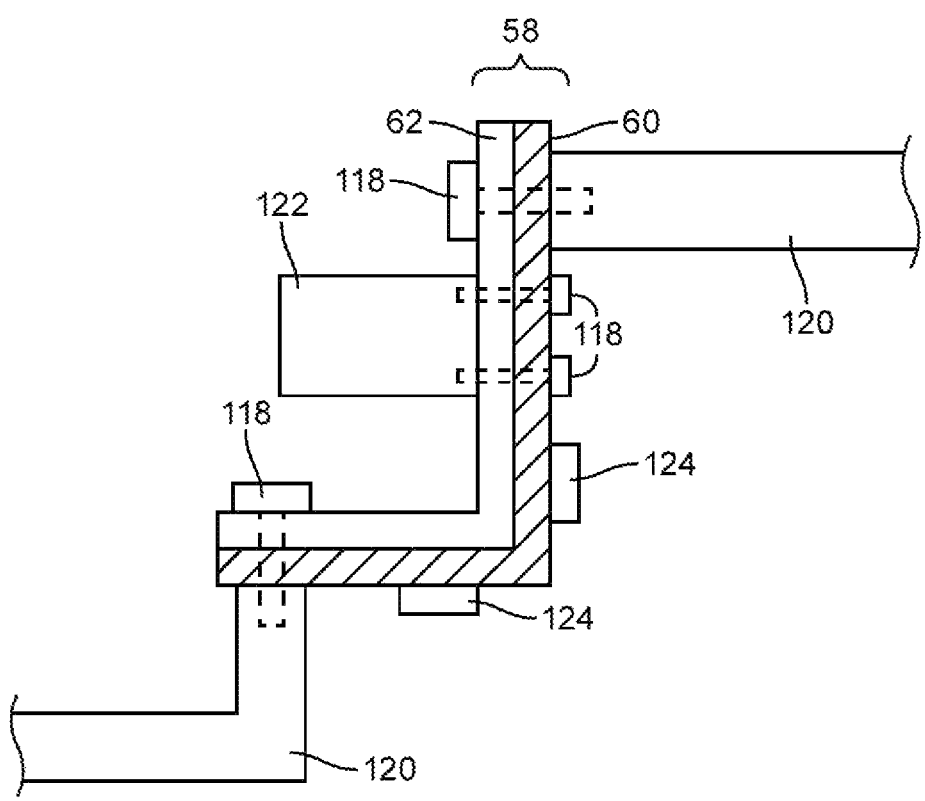
FIG. 10 is a cross-sectional side view of a flexible printed circuit with a stiffener that has been coupled to device structures in accordance with an embodiment.

Brackets that are formed from flexible printed circuit structures 58 may have any suitable shape. As an example, brackets may be formed from flexible printed circuit structures 58 that have louvers, press-in inserts, gussets, snaps, springs, or other shapes. Brackets may have multiple openings, engagement features that are configured to engage with other brackets or components, mounting ledges for receiving planar members and other structures, slots for receiving protrusions on components or other structures, etc. The illustrative bracket shape formed by flexible printed circuit structures 58 of FIG. 10 is merely an example. Flexible printed circuit brackets with bent sheet metal structures may have other shapes, if desired.

Figure 11:
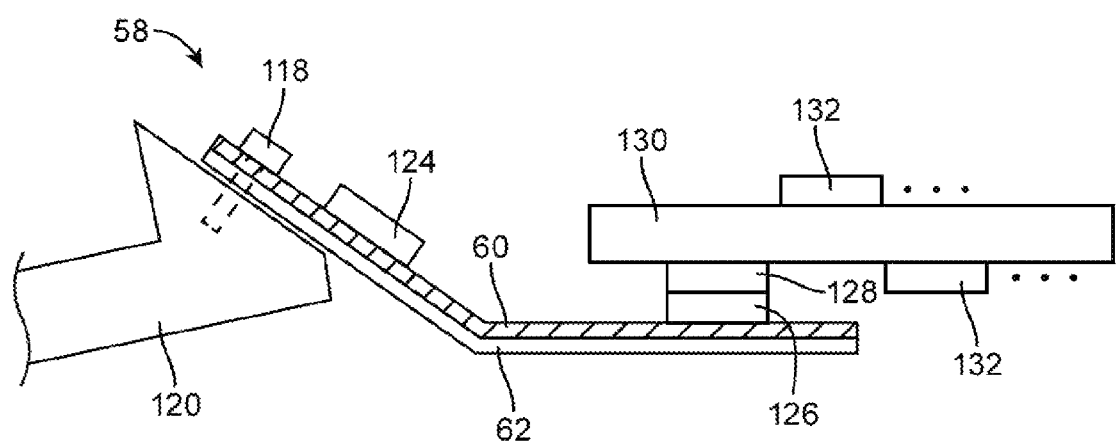
FIG. 11 is a cross-sectional side view of a flexible printed circuit with a stiffener that has been coupled to device structures and that has a connector for coupling the flexible printed circuit to other structures in accordance with an embodiment.

In the illustrative configuration of FIG. 11, printed circuit board 130 has opposing upper and lower surfaces on which components 132 have been mounted. Printed circuit board 130 may be a flexible printed circuit board or a rigid printed circuit board (as examples). Board 130 has board-to-board connector 128. Board-to-board connector 128 mates with a corresponding board-to-board connector such as connector 126 on flexible printed circuit 60 in bent flexible printed circuit structures 58. Components such as component 124 (e.g., integrated circuits, cameras, sensors, etc.) are mounted to flexible printed circuit 60. Metal stiffener 62 holds bent flexible printed circuit structures 58 in the bent configuration of FIG. 11. Screws such as screw 118 pass through openings in bent flexible printed circuit structures 58 to attach bent flexible printed circuit structures 58 to housing structures 120.

Figure 12:
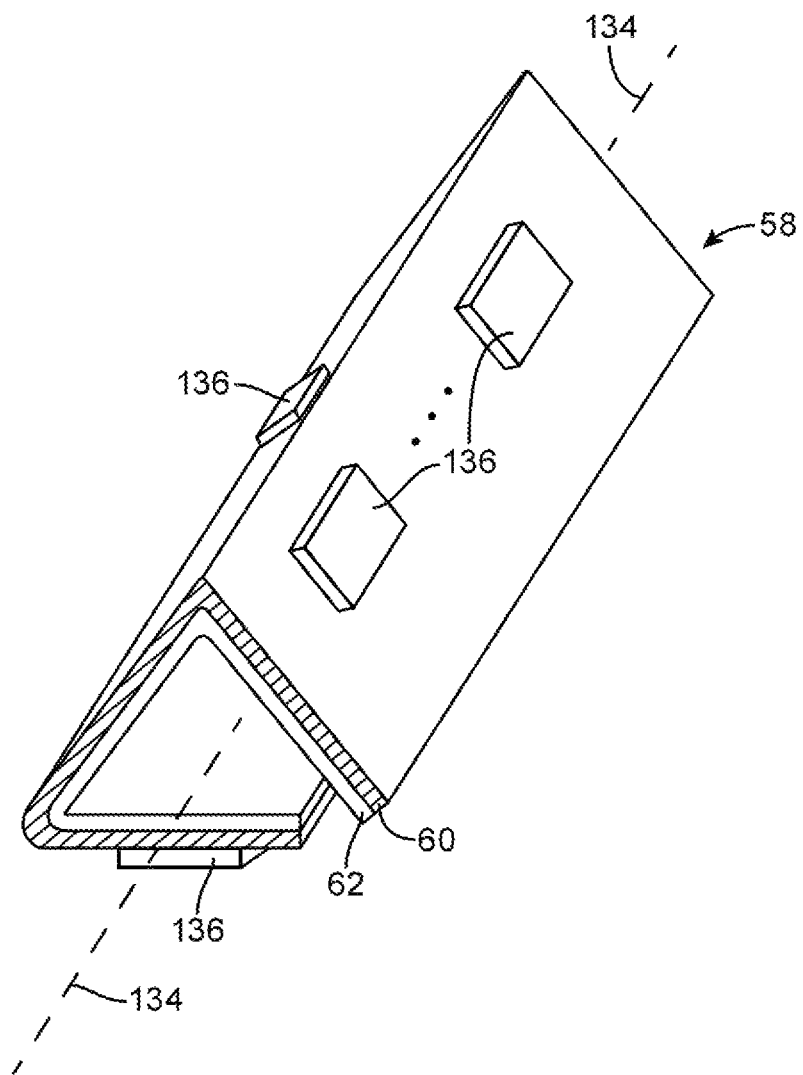
FIG. 12 is a perspective view of an illustrative flexible printed circuit with a bent stiffener that has been used to form an elongated hollow tube having a triangular cross-sectional shape and having components mounted on an exterior surface in accordance with an embodiment.

FIG. 12 shows how bent flexible printed circuit structures 58 may have multiple bends. In the configuration of FIG. 12, bent flexible printed circuit structures 58 form an elongated hollow tube. The tubular structures of FIG. 12 extend along longitudinal axis 134. There are two bends in bent flexible printed circuit structures 58, so that bent flexible printed circuit structures 58 have a triangular cross-sectional shape with a triangular interior cavity. Components 136 are mounted to flexible printed circuit 60 on the exterior surfaces of bent flexible printed circuit structures 58.

Figure 13:
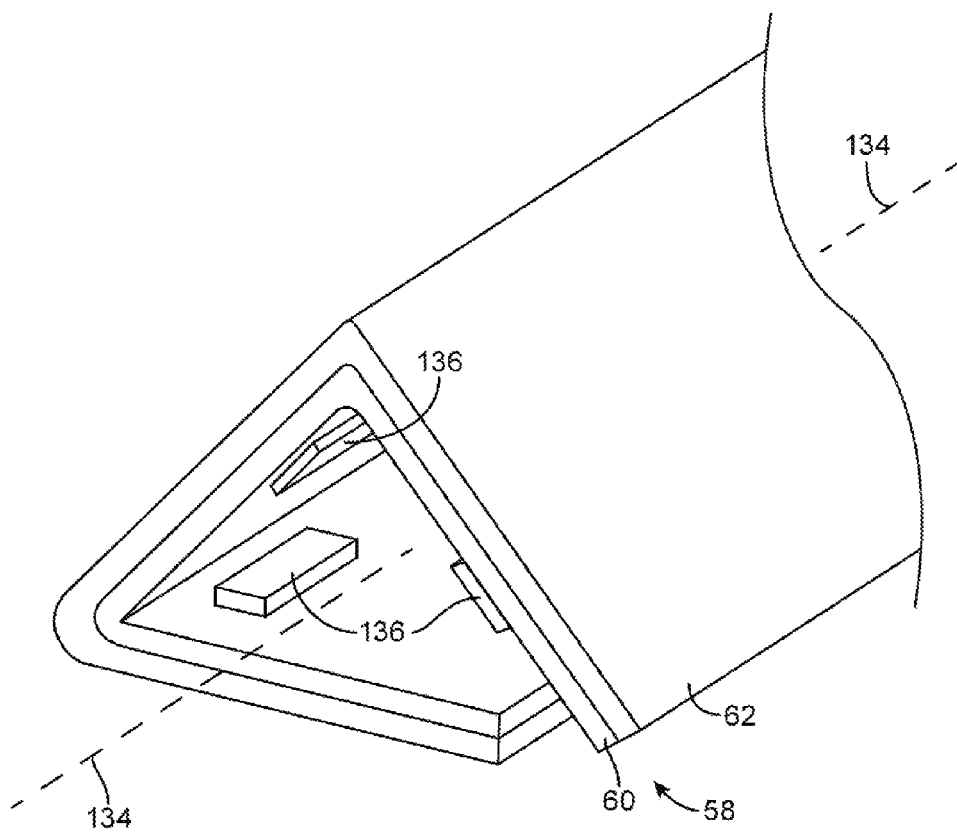
FIG. 13 is a perspective view of an illustrative flexible printed circuit with a bent stiffener that has been used to form an elongated hollow tube having a triangular cross-sectional shape and having components mounted on an interior surface in accordance with an embodiment.

In the configuration of FIG. 13, flexible printed circuit 60 has been formed on the inner surface of the tube formed by structures 58 and components 136 have been mounted on the interior surface of structures 58.

Figure 14:
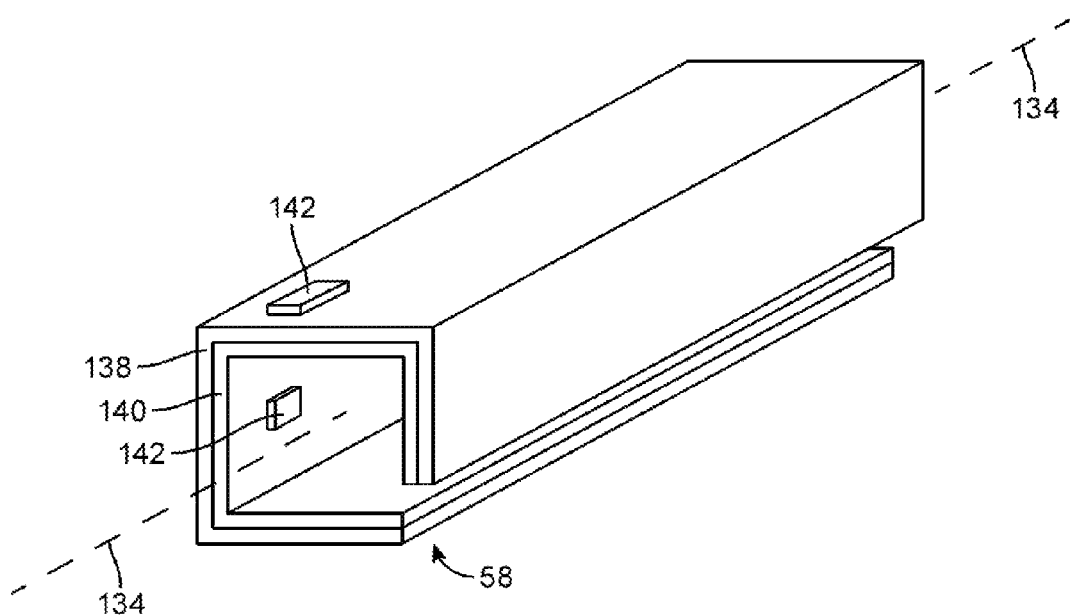
FIG. 14 is a perspective view of an illustrative flexible printed circuit with a bent stiffener that has been used to form a hollow tube having a rectangular cross-sectional shape in accordance with an embodiment.

FIG. 14 shows how bent flexible printed circuit structures 58 may have a rectangular cross-sectional shape. In the configuration of FIG. 14, bent flexible printed circuit structures 58 have inner layer 138 and outer layer 140. Layers 138 and 140 are bent to form an elongated hollow tube that extends along longitudinal axis 134. Layer 138 may be a flexible printed circuit and layer 140 may be a metal stiffening sheet or layer 138 may be a metal stiffening sheet and layer 140 may be a flexible printed circuit. Components 142 may be mounted to the flexible printed circuit on the inside or the outside of the tube.

Figure 15:
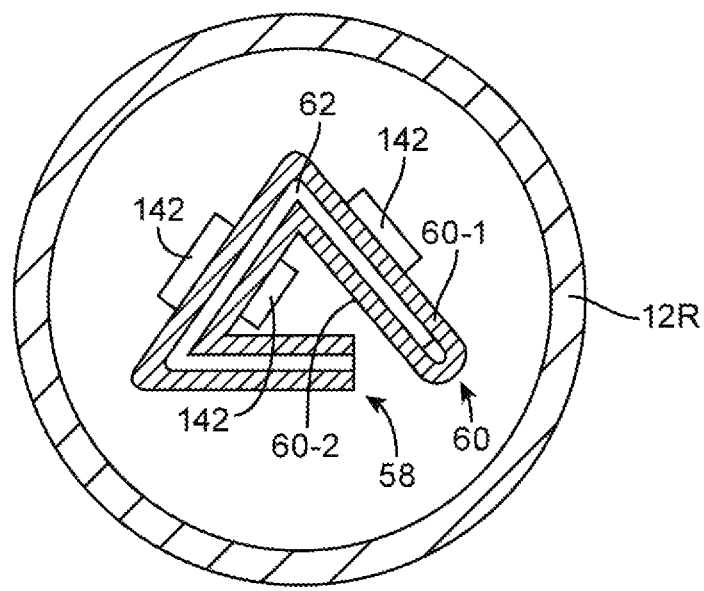
FIG. 15 is a cross-sectional end view of an illustrative flexible printed circuit that has been provided with a bent stiffener to form a tube with a triangular cross-sectional shape and that has been mounted within a cavity in an electronic device structure such as a clutch barrel cover in accordance with an embodiment.

FIG. 15 is a cross-sectional end view of bent flexible printed circuit structures 58 in a configuration in which bent flexible printed circuit structures 58 form an elongated tube (extending into the page in the orientation of FIG. 15). Flexible printed circuit structures 58 of FIG. 15 are surrounded by housing structures 12R. Structures 12R may be part of housing 12 of FIGS. 1, 2, 3, and 4. For example, housing structures 12R may form a clutch barrel cover for clutch barrel 20 of FIG. 1.

As shown in FIG. 15, stiffener 62 has been bent to form a tubular shape (extending into the page in the orientation of FIG. 15) having a triangular cross-sectional shape. Flexible printed circuit 60 has two portions. Outer portion 60-1 covers the outer surface of stiffener 62. Inner portion 60-2 covers the inner surface of stiffener 62. This type of two-sided arrangement for flexible printed circuit 60 allows components 142 to be mounted on both the interior and opposing exterior surfaces of the tube-shaped bent flexible printed circuit structures 58 formed using stiffener 62.

Figure 16:
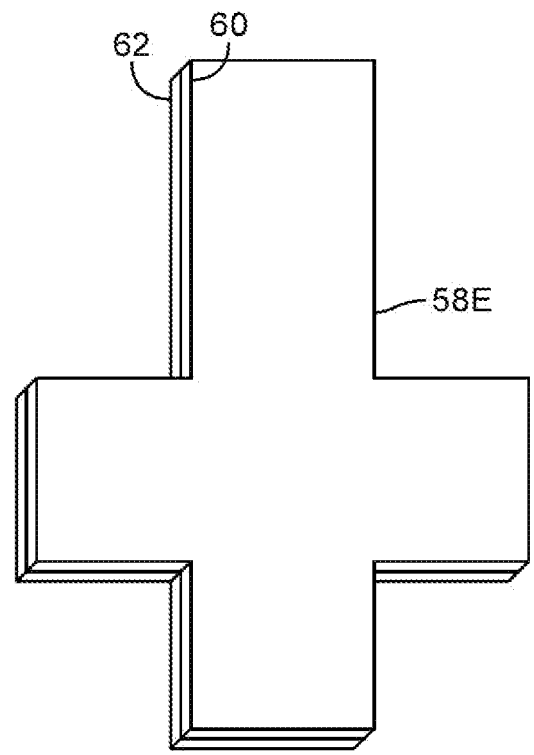
FIG. 16 is a perspective view of a flexible printed circuit mounted on an unbent stiffener in accordance with an embodiment.
Figure 17:
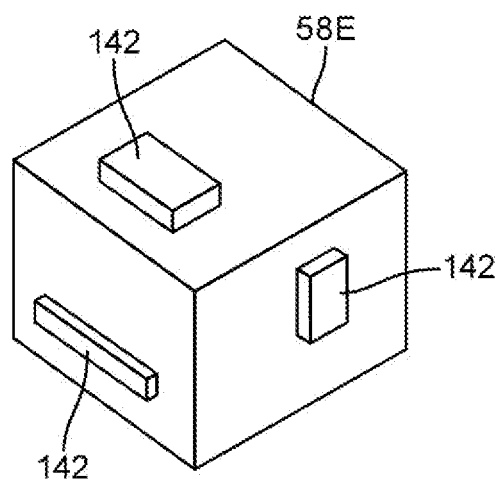
FIG. 17 is a diagram of the flexible printed circuit and stiffener of FIG. 16 following the formation of a cube from the flexible printed circuit and stiffener by bending the flexible printed circuit and stiffener in accordance with an embodiment.

FIG. 16 is a perspective view of illustrative flexible printed circuit structures 58 in an unbent configuration. The example of FIG. 16 shows how flexible printed circuit structures 58 may have an unbent shape that allows flexible printed circuit structures 58 to be bent to form an enclosure such as enclosure 58E of FIG. 17. In the example of FIGS. 16 and 17, the unbent structures of FIG. 16 have a layout that is suitable for forming into the cube-shaped bent structures of FIG. 17. Bent flexible printed circuit structures 58E of other shapes may be formed, if desired.

Components 142 may be mounted on the exterior of structures 58E (when flexible printed circuit 60 has exterior portions), on the interior of structures 58E (when flexible printed circuit 60 has interior portions), or on both the interior and exterior of structures 58E (when flexible printed circuit 60 has exterior portions such as portions 60-1 of FIG. 15 and interior portions such as portions 60-2 of FIG. 15.

The interior of structures 58E is hollow, so additional components can be mounted in the interior of structures 58E (e.g., batteries, etc.), if desired.

Figure 18:
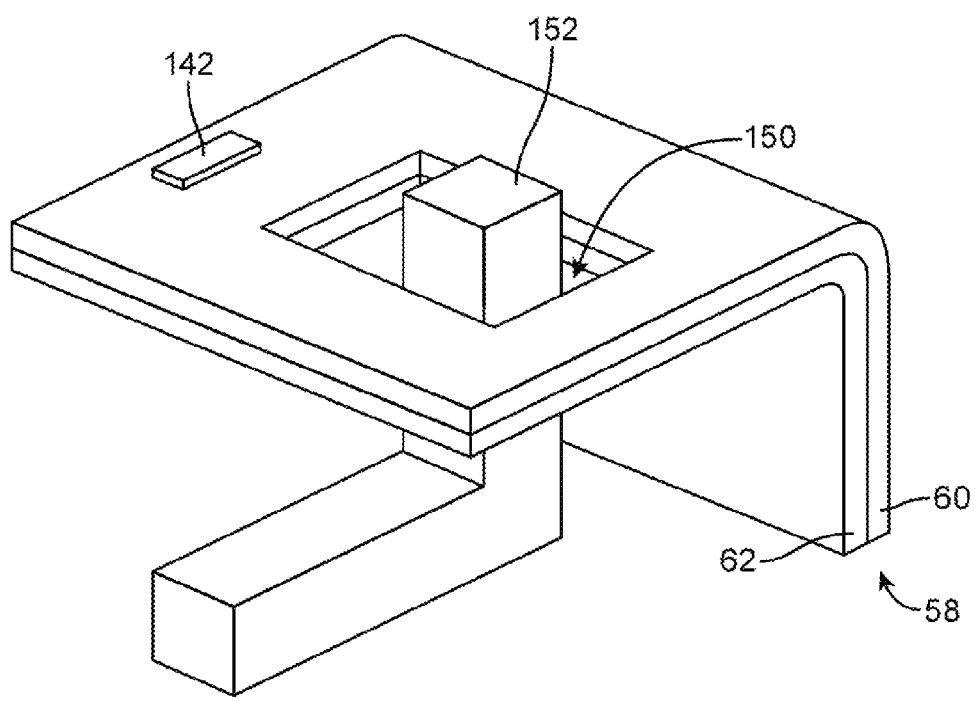
FIG. 18 is a perspective view of a flexible printed circuit mounted on a stiffener in a configuration in which the flexible printed circuit and stiffener have aligned openings to accommodate an electronic device structure such as an electrical component or housing structures in accordance with an embodiment.

FIG. 18 is a perspective view of illustrative bent flexible printed circuit structures 58 with an opening such as opening 150 to accommodate components such as component 152. Component 152 may be a portion of housing 12, an electronic component, or other structure in device 10. Opening 150 may have a notch shape with an open edge or may have a closed shape such as the rectangular shape of FIG. 18, a circular shape, a shape with curved edges, a shape with straight edges, or a shape with a combination of straight and curved edges.

Figure 19:
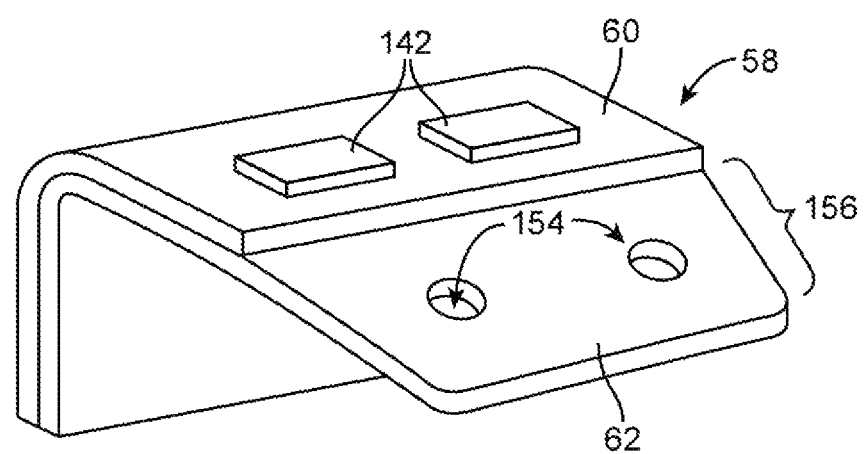
FIG. 19 is a perspective view of a flexible printed circuit mounted on a stiffener so that a portion of the stiffener that has openings is not covered by the flexible printed circuit in accordance with an embodiment.

In the illustrative configuration of FIG. 19, portion 156 of stiffener 62 in bent flexible printed circuit structures 58 is uncovered by flexible printed circuit 60. Leaving portion 156 of stiffener 62 bare of flexible printed circuit materials allows fasteners and other structures to bear directly against stiffener 62 in the vicinity of openings 154. If desired, flexible printed circuit 60 may have a portion that overhangs the edge of stiffener 62 such as illustrative tail portion 60B of FIGS. 8A and 8B.

Figure 20:
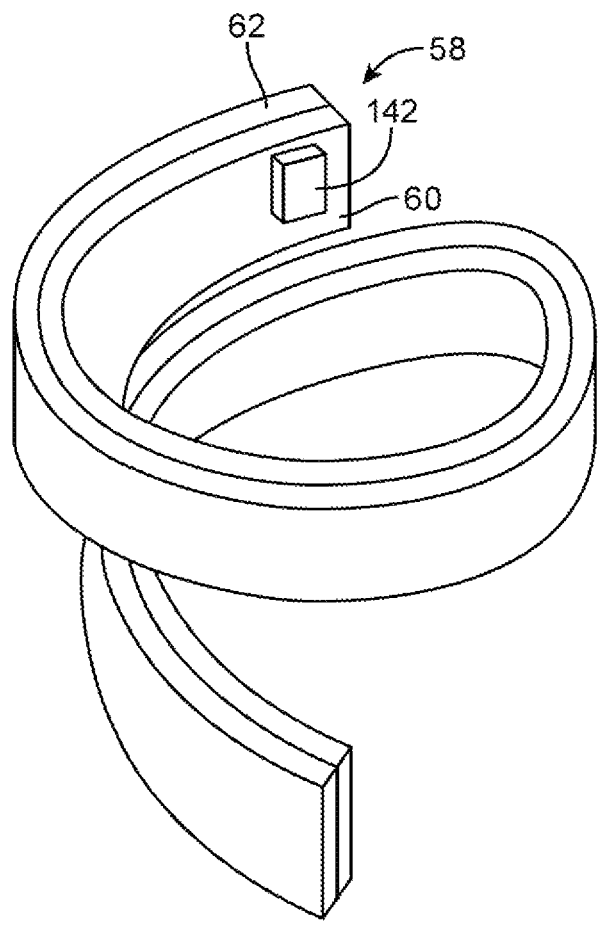
FIG. 20 is a perspective view of a flexible printed circuit mounted on a stiffener in a spiral configuration in accordance with an embodiment.

FIG. 20 is a perspective view of bent flexible printed circuit structures 58 in a configuration in which bent flexible printed circuit structures 58 have a spiral shape. Components such as component 142 may be mounted on flexible printed circuit 60. Spiral-shaped stiffener 62 holds flexible printed circuit 60 in a desired shape such as a shape with a cylindrical shape, as shown in FIG. 20. Flexible printed circuit structures 58 of the type shown in FIG. 20 may have multiple loops (e.g., two or more, five or more, or ten or more) and may be installed within cylindrical portions of housing 12 or other portions of device 10 (as examples).

Figure 21:
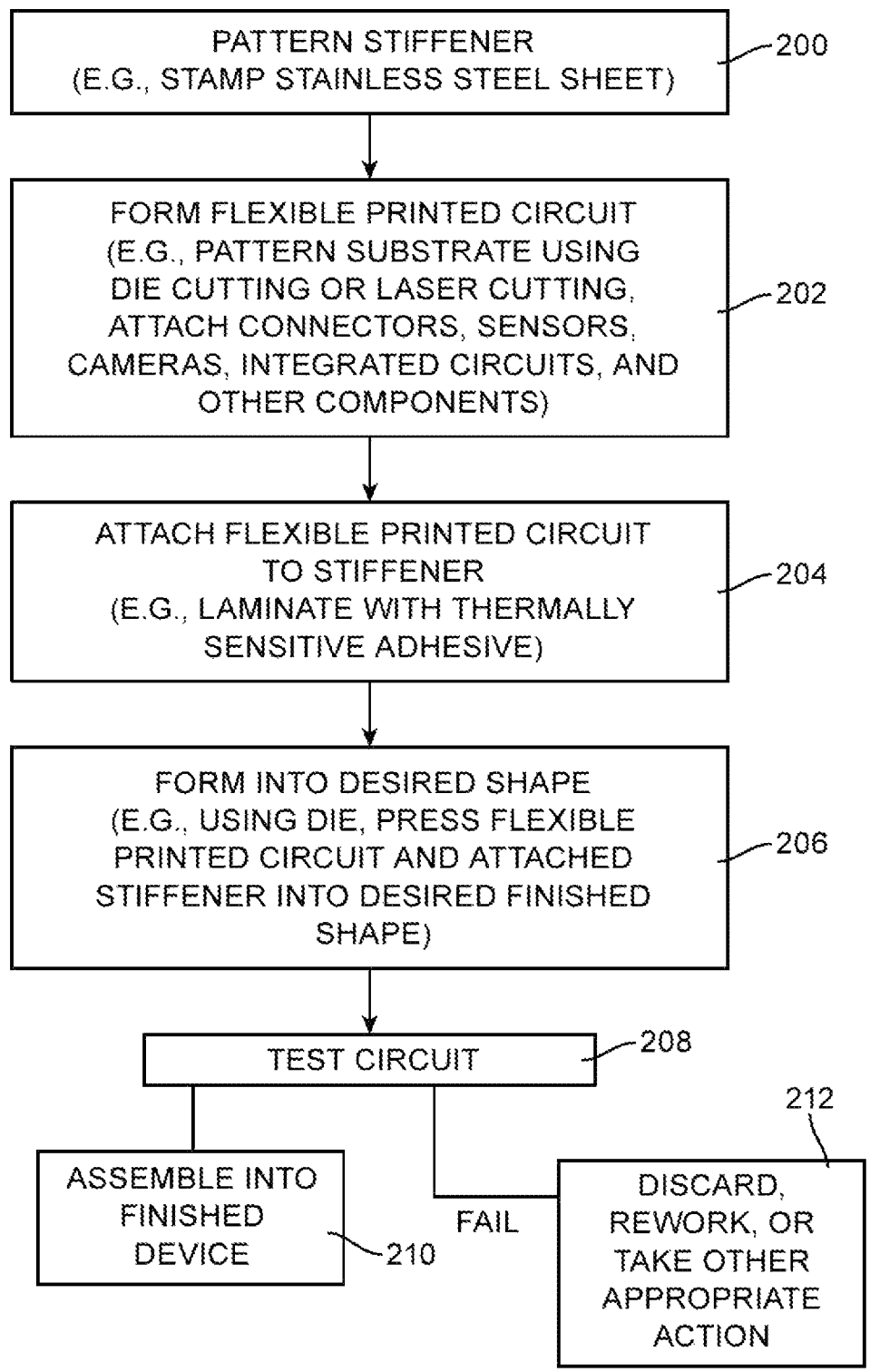
FIG. 21 is a flow chart of illustrative steps involved in forming an electronic device having one or more flexible printed circuits with bent stiffeners in accordance with an embodiment of the present invention.

Illustrative steps involved in forming electronic devices having bent flexible printed circuit structures 58 are shown in FIG. 21. At step 200, equipment such as patterning equipment 80 of FIG. 7 forms stiffener 62. Openings such as opening 82 can be incorporated into stiffener 62, if desired. Stiffener 62 may be formed from stainless steel, other metals, or other materials that hold shape when bent. Techniques such as stamping, die cutting, machining using a cutting bit, or other fabrication techniques may be used to form stiffener 62.

At step 202, flexible printed circuit 60 is patterned and populated with components using equipment 70 (FIG. 7). Techniques such as soldering, die cutting, laser cutting, metal trace patterning, and other techniques may be used in forming flexible printed circuit 60.

At step 204, flexible printed circuit layer 60 may be laminated to stiffener 62. Lamination operations may involve the application of a thermally cured adhesive or other adhesive. A heat source such as an oven or heat gun can apply heat to the thermally cured adhesive to facilitate curing. If desired, flexible printed circuit layer 60 may be laminated to stiffener 62 before mounting components on flexible printed circuit layer and/or before patterning flexible printed circuit layer 60.

At step 206, computer-controlled die presses or other bending equipment may be used to bend stiffener 62 and attached flexible printed circuit 60 into a desired bent shape.

At step 208, after attaching flexible printed circuit 60 to stiffener 62 and bending stiffener 62 and flexible printed circuit 60 into a desired shape to form bent flexible printed circuit structures 58, circuitry on structures 58 is preferably tested using test system 86 (FIG. 7). If structures 58 fail testing, structures 58 can be reworked or discarded. In response to passing testing, structures 58 and other structures 100 (e.g., device housing structures, additional device components, etc.) can be assembled to form finished electronic device 10 using assembly equipment 98 (FIG. 7).

The foregoing is merely illustrative and various modifications can be made by those skilled in the art without departing from the scope and spirit of the described embodiments. The foregoing embodiments may be implemented individually or in any combination.

What is claimed is:

1. An apparatus, comprising:
   a flexible printed circuit; and
   a bent sheet metal stiffener laminated to the flexible printed circuit, wherein the bent sheet metal stiffener has an opening that overlaps at least a portion of the flexible printed circuit such that the portion of flexible printed circuit is exposed through and completely covers the opening in the bent sheet metal stiffener.

2. The apparatus defined in claim 1 wherein the bent sheet metal stiffener is bent along a bend axis and wherein the opening in the bent sheet metal stiffener overlaps the bend axis.

3. The apparatus defined in claim 1 wherein the bent sheet metal stiffener is bent along a bend axis and wherein the opening in the bent sheet metal stiffener does not overlap the bend axis.

4. The apparatus defined in claim 1 further comprising test points on the flexible printed circuit that are accessible through the opening.

5. The apparatus defined in claim 1 wherein the sheet metal stiffener comprises stainless steel with a thickness of 0.05 to 0.2 mm.

6. The apparatus defined in claim 1 wherein the bent sheet metal stiffener is configured to form a mounting bracket.

7. The apparatus defined in claim 6 wherein the mounting bracket has screw holes.

8. The apparatus defined in claim 1 wherein the bent sheet metal stiffener has at least three bends.

9. The apparatus defined in claim 1 wherein the bent sheet metal stiffener is configured to form a tube with multiple flat sides.

10. The apparatus defined in claim 1 wherein the flexible printed circuit has a flexible tail that extends from the bent sheet metal stiffener.

11. The apparatus defined in claim 10 further comprising at least one component mounted to the flexible tail.

12. The apparatus defined in claim 1 further comprising an electrical component mounted to the flexible printed circuit through the opening.

13. The apparatus defined in claim 1 wherein the bent sheet metal stiffener has a notch and wherein the flexible printed circuit has a flexible tail that extends from the bent sheet metal stiffener at the notch.

14. An apparatus, comprising:
a flexible printed circuit;
a bent sheet metal stiffener laminated to the flexible printed circuit, wherein the bent sheet metal stiffener has an opening, and wherein a portion of flexible printed circuit is directly adjacent to and exposed through the opening; and
at least one electrical component mounted to the flexible printed circuit, wherein the flexible printed circuit has a plurality of flat regions and a plurality of bent regions and wherein each bent region is interposed between two of the flat regions.

15. The apparatus defined in claim 14, wherein the flexible printed circuit has a cross-sectional shape selected from the group consisting of: a triangular cross-sectional shape and a rectangular cross-sectional shape.

16. The apparatus defined in claim 14, wherein the flexible printed circuit has opposing interior and exterior surfaces, wherein the interior surface is surrounded by the exterior surface, and wherein the bent sheet metal stiffener is laminated to the exterior surface of the flexible printed circuit.

17. The apparatus defined in claim 14, wherein the flexible printed circuit has opposing interior and exterior surfaces, wherein the interior surface is surrounded by the exterior surface, and wherein the bent sheet metal stiffener is laminated to the interior surface of the flexible printed circuit.

18. The apparatus defined in claim 14 further comprising a tube-shaped housing structure, wherein the flexible printed circuit is surrounded by the tube-shaped housing structure.

19. The apparatus defined in claim 18, wherein the tube-shaped housing structure comprises a clutch barrel.

20. The apparatus defined in claim 1, wherein the opening and the bent sheet metal stiffener are coplanar.

21. The apparatus defined in claim 2, wherein the opening is completely surrounded by the bent sheet metal stiffener.

22. The apparatus defined in claim 13, wherein the notch comprises an opening that is only partially surrounded by the bent sheet metal stiffener.

23. The apparatus defined in claim 14, wherein the at least one electrical component is mounted to the flexible printed circuit through the opening.

24. The apparatus defined in claim 14, wherein the opening and the bent sheet metal stiffener are coplanar.

* * * * *